United States Patent
Morikawa

(10) Patent No.: US 6,570,811 B1
(45) Date of Patent: May 27, 2003

(54) WRITING OPERATION CONTROL CIRCUIT AND SEMICONDUCTOR MEMORY USING THE SAME

(75) Inventor: Koichi Morikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/115,003

(22) Filed: Apr. 4, 2002

(51) Int. Cl.[7] ................................................. G11C 8/00
(52) U.S. Cl. ........................... 365/230.06; 365/189.09; 365/185.23
(58) Field of Search ................... 365/189.01, 189.09, 365/189.11, 185.2, 185.23, 185.22, 203, 230.06, 226, 154

(56) References Cited

U.S. PATENT DOCUMENTS

| | | | | |
|---|---|---|---|---|
| 5,909,398 A | * | 6/1999 | Tanzawa et al. | 365/185.29 |
| 5,930,169 A | * | 7/1999 | Iwata et al. | 365/185.09 |
| 5,940,322 A | * | 8/1999 | Atsumi | 365/185.18 |

FOREIGN PATENT DOCUMENTS

| | | |
|---|---|---|
| JP | 07-296587 | 11/1995 |
| JP | 10-189884 | 7/1998 |

OTHER PUBLICATIONS

Page 322 of Literature "CMOS VLSI . . . ", which describes a circuit diagram 8.57 of a writing circuit for RAMs.
Specification of SRAM "HM621400JC" by Hitachi, which describes characteristics in writing operation, in pp. 8, 10 and 11.

* cited by examiner

*Primary Examiner*—David Nelms
*Assistant Examiner*—Gene N. Auduong
(74) *Attorney, Agent, or Firm*—Volentine Francos, PLLC

(57) ABSTRACT

A writing operation control circuit for a semiconductor memory includes a driving circuit which operates to perform a writing operation in response to a writing data signal, the driving circuit having a specific threshold voltage; a first voltage control circuit which selectively outputs first and second supply voltages to the driving circuit in response to a logical level of a write controlling signal; and a second voltage control circuit which selectively outputs third and fourth supply voltages to the driving circuit in response to a logical level of the write controlling signal. The second supply voltage is higher than the first supply voltage, the first supply voltage is higher than the fourth supply voltage, and the fourth supply voltage is higher than the third supply voltage.

28 Claims, 9 Drawing Sheets

US 6,570,811 B1

WRITING OPERATION CONTROL CIRCUIT AND SEMICONDUCTOR MEMORY USING THE SAME

TECHNICAL FIELD OF THE INVENTION

This invention relates generally to a semiconductor apparatus, such as a SRAM operating at a lower supply voltage.

BACKGROUND OF THE INVENTION

A semiconductor memory includes a writing operation control circuit, which control writing operation of digital data to a plurality of memory cells. Recently, it is required to design a semiconductor memory having both low power consumption and higher speed operation characteristics. In order to increase operating speed of a memory, threshold voltages Vth of MOS transistors should be lowered. However, when threshold voltages Vth of MOS transistors are lowered, leak current of the MOS transistors is increased.

OBJECTS OF THE INVENTION

Accordingly, an object of the present invention is to provide a writing operation control circuit, in which operating speed can be improved and at the same time leak current of MOS transistors can be decreased.

Another object of the present invention is to provide a semiconductor memory having an improved writing operation control circuit, in which operating speed can be improved and at the same time leak current of MOS transistors can be decreased.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a writing operation control circuit for a semiconductor memory includes a write control terminal, to which a write controlling signal indicating enable or disable of writing is supplied; a writing data terminal, to which a writing data signal is supplied; a driving circuit which operates to perform a writing operation in response to the writing data signal, the driving circuit having a specific threshold voltage; a first voltage control circuit which selectively outputs first and second supply voltages to the driving circuit in response to a logical level of the write controlling signal; and a second voltage control circuit which selectively outputs third and fourth supply voltages to the driving circuit in response to a logical level of the write controlling signal. The second supply voltage is higher than the first supply voltage, the first supply voltage is higher than the fourth supply voltage, the fourth supply voltage is higher than the third supply voltage.

According to a second aspect of the present invention, a semiconductor memory includes a plurality of memory cells each of which store digital data; and a writing operation control circuit connected to the plurality of memory cells. The writing operation control circuit for a semiconductor memory includes a write control terminal, to which a write controlling signal indicating enable or disable of writing is supplied; a writing data terminal, to which a writing data signal is supplied; a driving circuit which operates to perform a writing operation in response to the writing data signal, the driving circuit having a specific threshold voltage; a first voltage control circuit which selectively outputs first and second supply voltages to the driving circuit in response to a logical level of the write controlling signal; and a second voltage control circuit which selectively outputs third and fourth supply voltages to the driving circuit in response to a logical level of the write controlling signal. The second supply voltage is higher than the first supply voltage, the first supply voltage is higher than the fourth supply voltage, the fourth supply voltage is higher than the third supply voltage.

BRIEF DESCRIPTION OF THE DRAWINGS

FIG. 2 is a memory cell used in a semiconductor memory, the present invention is applied to.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
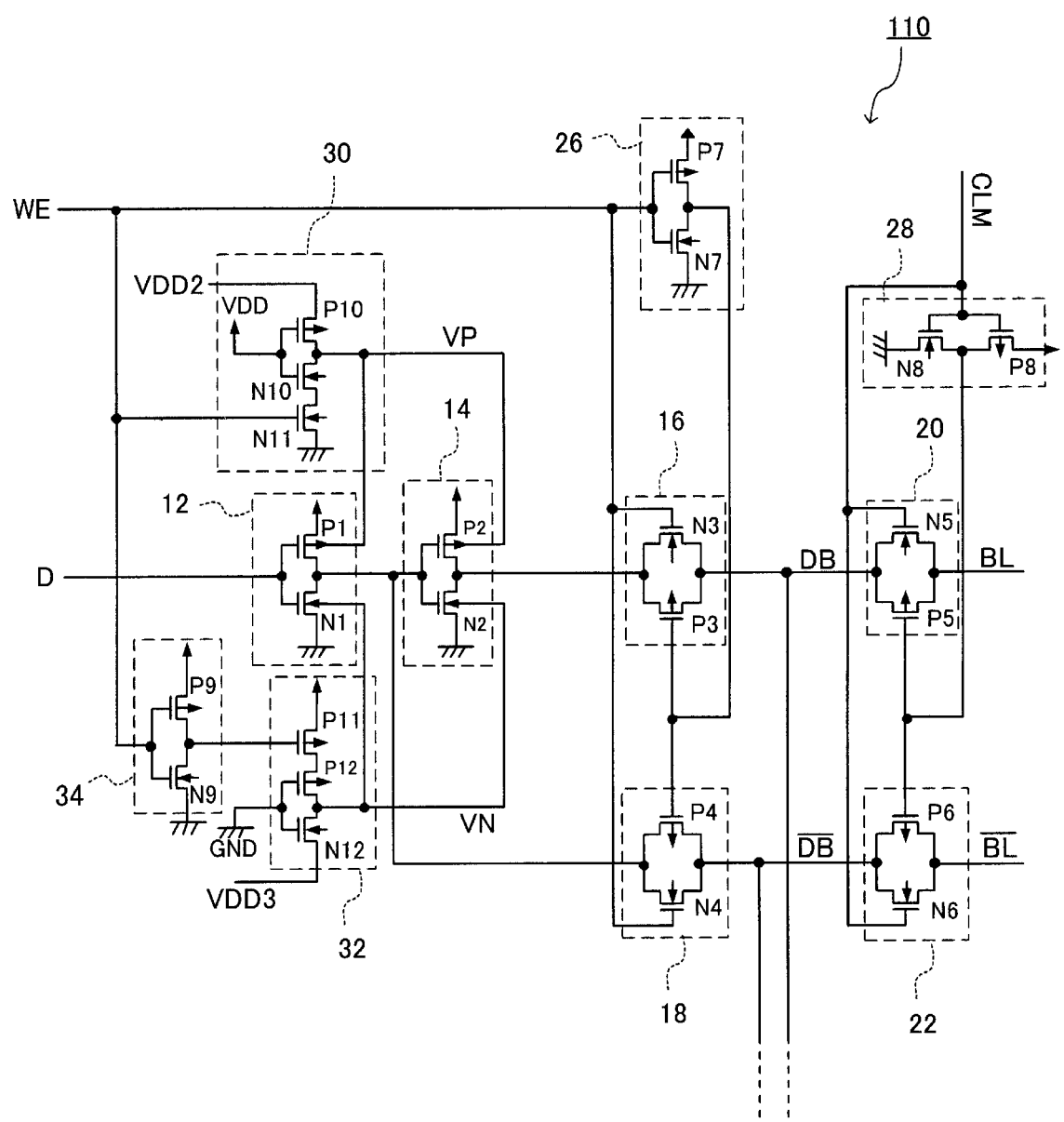
FIG. 1 is a circuit diagram showing a writing operation control circuit 110 for a semiconductor memory according to a first preferred embodiment of the present invention.
Figure 2:
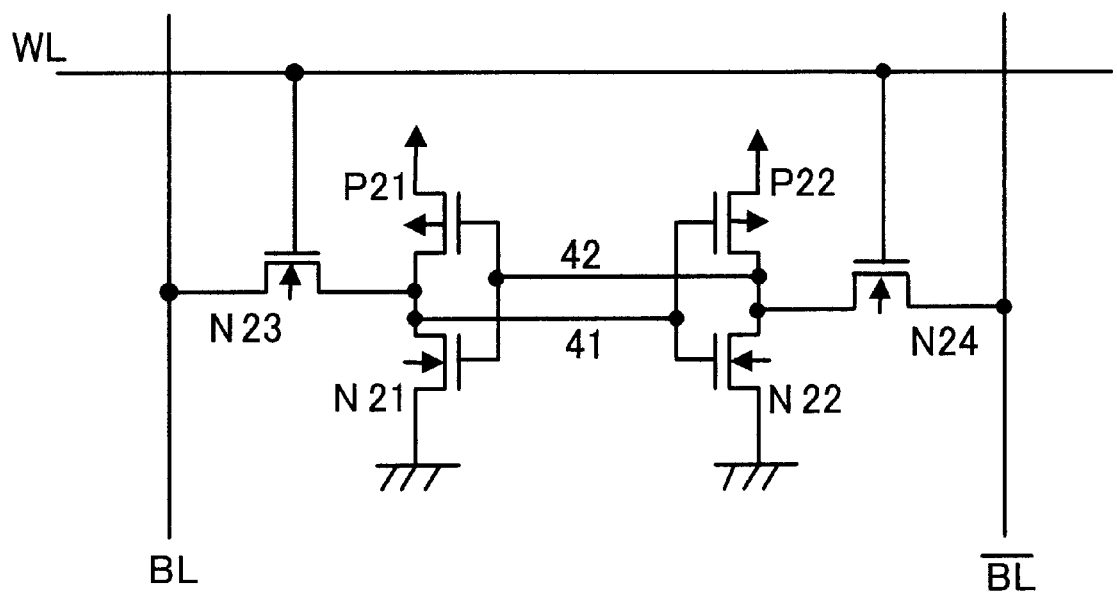
Figure 3:
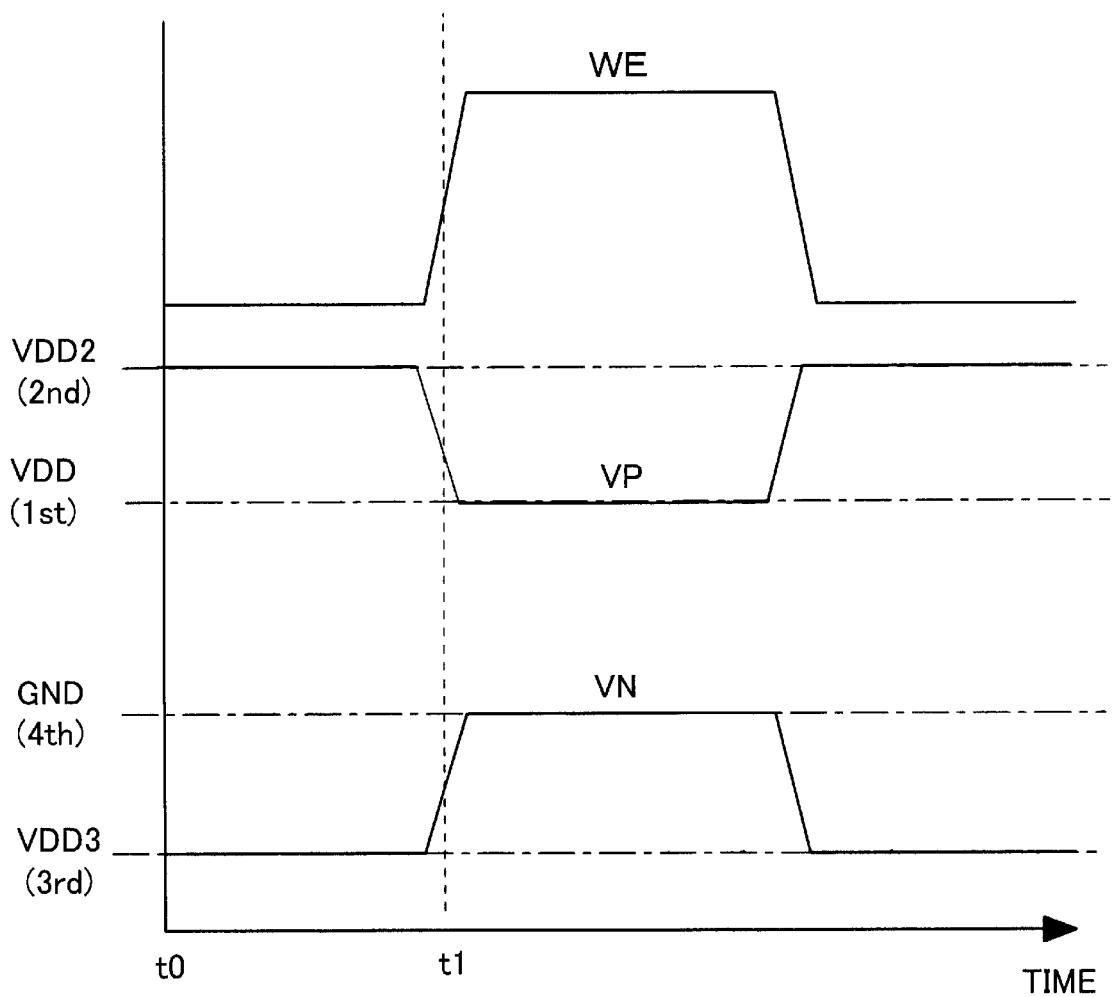
FIG. 3 is a timing chart showing the operation of the first preferred embodiment.

FIG. 1 is a circuit diagram showing a writing operation control circuit 110 for a semiconductor memory according to a first preferred embodiment of the present invention. FIG. 2 is a memory cell used in a semiconductor memory, the present invention is applied to. A semiconductor memory, such as SRAM, includes a writing operation control circuit and a memory cell array. FIG. 3 is a timing chart showing the operation of the first preferred embodiment. The present invention is especially useful for a semiconductor memory having a supply voltage VDD lower than 0.5V.

The writing operation control circuit 110 includes a write control terminal WE, to which a write controlling signal indicating enable or disable of writing is supplied; and a writing data terminal D, to which a writing data signal is supplied; first and second driving circuits 12 and 14 which operate to perform a writing operation in response to the writing data signal. The driving circuits 12 and 14 have their specific threshold voltages and turn on when a voltage higher that its threshold voltage is applied.

The writing operation control circuit 110 further includes a first voltage control circuit 30 which selectively outputs first and second supply voltages VDD and VDD2 to the driving circuits 12 and 14 in response to the write controlling signal WE; and a second voltage control circuit 32 which selectively outputs third and fourth supply voltages VDD3 and GND to the driving circuit 12 and 14 in response to the write controlling signal WE. The the second supply voltage VDD2 is higher than the first supply voltage VDD, the first supply voltage VDD is higher than the fourth supply voltage GND, the fourth supply voltage GND is higher than the third supply voltage VDD3.

The first voltage control circuit 30 outputs the first supply voltage VDD and second supply voltage VDD2, when the write controlling signal indicates enable and disable of writing, respectively. The second voltage control circuit 32 outputs the fourth supply voltage GND and third supply voltage VDD3, when the write controlling signal indicates enable and disable of writing, respectively.

Each of the threshold voltage of the driving circuits 30 and 32 becomes a first level when the write controlling signal indicates enable of writing, and becomes a second level, which is lower than the first level, when the write controlling signal indicates disable of writing.

The first driving circuit 12 is a CMOS inverter including a PMOS transistor P1 and an NMOS transistor N1. The second driving circuit 14 is also a CMOS inverter including a PMOS transistor P2 and an NMOS transistor N2. An output terminal of the first voltage control circuit 30 is coupled to N-type substrate regions (N-well regions) in the PMOS transistors P1 and P2 of the first and second driving circuits 12 and 14. An output terminal of the second voltage control circuit 32 is coupled to P-type substrate regions (P-well regions) in the NMOS transistors N1 and N2 of the first and second driving circuits 12 and 14.

The writing operation control circuit 110 further includes an inverter circuit 34 coupled to the write control terminal WE; first and second transfer gates 16 and 18, which are used for writing operation of data; third and fourth transfer gates 20 and 22, which are used for selecting columns in writing operation; and inverters 26 and 28. An input terminal of the inverter 34 is connected to the write control terminal WE. Input terminals of the first and second transfer gates 16 and 18 are connected to output terminals of the first and second driving circuits 12 and 14, respectively. Output terminals of the first and second transfer gates 16 and 18 are connected to data lines DB. The first transfer gate 16 includes an NMOS transistor N3 and a PMOS transistor P3. The second transfer gate 18 includes an NMOS transistor N4 and a PMOS transistor P4. Input terminals of the third and fourth transfer gates 20 and 22 are connected to output terminals of the first and second transfer gates 16 and 18, respectively. The third transfer gate 20 includes an NMOS transistor N5 and a PMOS transistor P5. The fourth transfer gate 22 includes an NMOS transistor N6 and a PMOS transistor P6.

An input terminal of the inverter 26 is connected to the write control terminal WE, and an output terminal thereof is connected to the gates of the PMOS transistors P3 and P4 in the first and second transfer gates 16 and 18. An input terminal of the inverter 28 is connected to a column line CLM, and an output terminal thereof is connected to the gates of the PMOS transistors P5 and P6 in the third and fourth transfer gates 20 and 22. The column line CLM is also connected to gates of the NMOS transistor N5 and N6 in the third and fourth transfer gates 20 and 22. Output terminals of the third and fourth transfer gates 20 and 22 are connected to a bit line BL and its reverse, respectively.

The first voltage control circuit 30 includes a PMOS transistor P10, source and gate of which are supplied with the second supply voltage VDD2 and the first supply voltage VDD, respectively; an NMOS transistor N10, a drain of which is connected to a drain of the first PMOS transistor P10, and a gate of which is supplied with the first supply voltage VDD; and an NMOS transistor N11, a drain of which is connected to a source of the first NMOS transistor N10, and a gate of which is connected to the write control terminal WE. A source of the NMOS transistor N11 is grounded. An output terminal of the first voltage control circuit 30 is formed between the drains of the PMOS transistor P10 and NMOS transistor N10.

The second voltage control circuit includes a PMOS transistor P11, a gate of which is connected to an output of the inverter circuit 34; a. PMOS transistor P12, a source of which is connected to a drain of the PMOS transistor P11, and a gate of which is grounded; and an NMOS transistor N12, a drain of which is connected to a drain of the PMOS transistor P12, and a source of which is supplied with the third supply voltage VDD3. An output terminal of the second voltage control circuit 32 is formed between the drain of the PMOS transistor P12 and the drain of the NMOS transistor N12.

In order to reduce standby leak current, N-type substrate regions (N-well regions) of the PMOS transistors other than P1 and P2 are supplied with the second supply voltage VDD2, while P-type substrate regions (P-well regions) of the NMOS transistors other than N1 and N2 are supplied with the third supply voltage VDD3.

Referring now to FIG. 2, a memory cell is connected between two bit lines BL. The memory cell includes NMOS transistors N21, N22, N23 and N24, and PMOS transistors P21 and P22. A gate of the PMOS transistor P21 is connected to a memory cell node 42. Source, drain and gate of the NMOS transistor N21 is connected to the ground, a drain of the PMOS transistor P21 and the memory cell node 42, respectively. The NMOS transistor N23 is connected at a gate a word line WL. A gate of the PMOS transistor P22 is connected to a memory cell node 41. Source, drain and gate of the NMOS transistor N22 is connected to the ground, a drain of the PMOS transistor P21 and the memory cell node 41, respectively. The NMOS transistor N24 is connected at a gate a word line WL.

Next, referring to FIG. 3, when the write control terminal WE is supplied with a write controlling signal at a level "1", indicating enable of writing operation, the first and second voltage control circuits 30 and 32 output the first and fourth supply voltages VDD and GND, respectively. At this time, each of the PMOS transistor P1 and NMOS transistor N1 in the first driving circuit 12, and the PMOS transistor P2 and NMOS transistor N2 in the second driving circuit 14 has lower threshold voltages. As a result, writing operation to the memory cell array is performed at a higher speed.

On the other hand, when the write control terminal WE is supplied with a write controlling signal at a level "0", indicating disable of writing operation, the first and second voltage control circuits 30 and 32 output the second and third supply voltages VDD2 and VDD3, respectively. At this time, each of the PMOS transistor P1 and NMOS transistor N1 in the first driving circuit 12, and the PMOS transistor P2 and NMOS transistor N2 in the second driving circuit 14 has lower threshold voltages. As a result, standby leak current is reduced.

The present invention is applicable to a circuit formed on an SOI substrate to control a body potential of MOS transistors.

Figure 4:
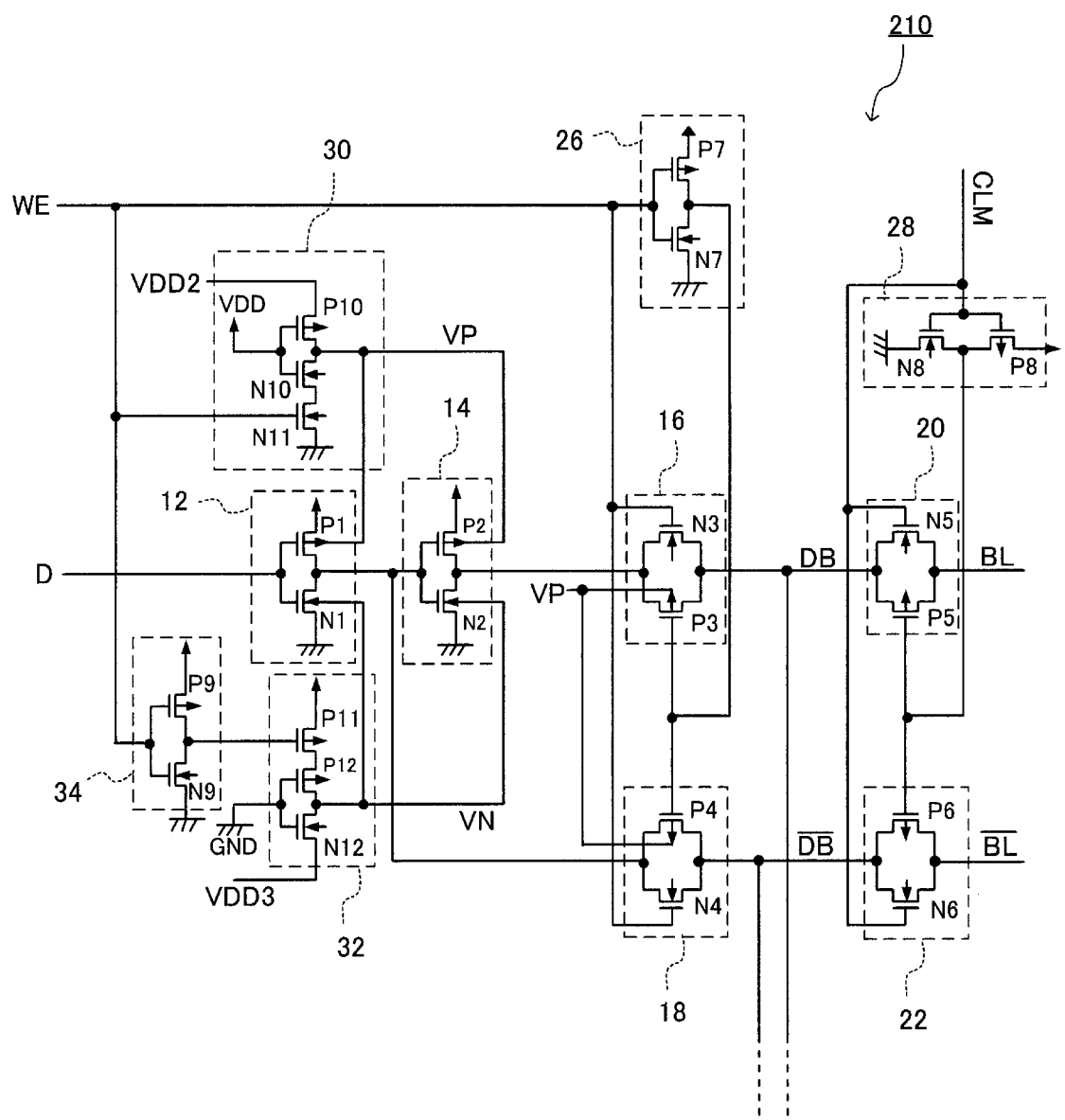
FIG. 4 is a circuit diagram showing a writing operation control circuit 210 for a semiconductor memory according to a second preferred embodiment of the present invention.

FIG. 4 is a circuit diagram showing a writing operation control circuit 210 for a semiconductor memory according to a second preferred embodiment of the present invention. In FIG. 4, the same or corresponding elements to those shown in FIGS. 1–3 are represented by the same reference numerals, and the same description is not repeated. In the second preferred embodiment, the output terminal of the first voltage control circuit 30 is connected to N-type substrate regions (N-well regions) of the PMOS transistors P3 and P4 in the first and second transfer gates 16 and 18.

According to this embodiment, when the write control terminal WE is supplied with a write controlling signal at a level "1", indicating enable of writing operation, the first supply voltage VDD is supplied to the N-type substrate regions (N-well regions) of the PMOS transistors P3 and P4. As a result, writing operation to the memory cell array is performed at a higher speed as compared to the first preferred embodiment.

On the other hand, when the write control terminal WE is supplied with a write controlling signal at a level "0", indicating disable of writing operation, the second supply voltage VDD2 is supplied to the N-type substrate regions (N-well regions) of the PMOS transistors P3 and P4.

Figure 5:
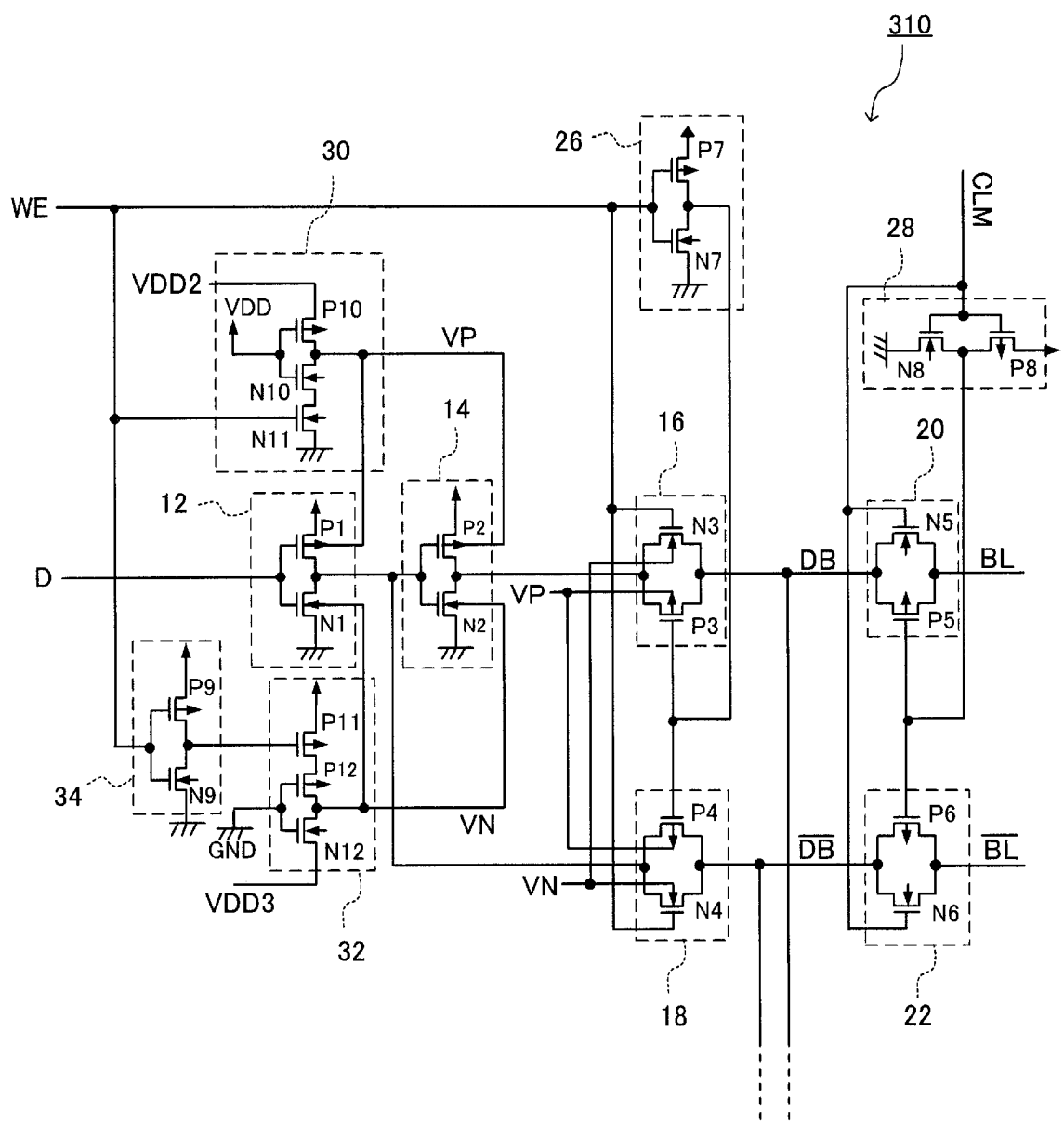
FIG. 5 is a circuit diagram showing a writing operation control circuit 310 for a semiconductor memory according to a third preferred embodiment of the present invention.

FIG. 5 is a circuit diagram showing a writing operation control circuit 310 for a semiconductor memory according to a third preferred embodiment of the present invention. In FIG. 5, the same or corresponding elements to those shown in FIGS. 1–4 are represented by the same reference numerals, and the same description is not repeated. In the second preferred embodiment, the output terminal of the second voltage control circuit 32 is also connected to P-type substrate regions (P-well regions) of the NMOS transistors N3 and N4 in the first and second transfer gates 16 and 18.

According to this embodiment, when the write control terminal WE is supplied with a write controlling signal at a level "1", indicating enable of writing operation, the fourth supply voltage GND is supplied to the P-type substrate regions (P-well regions) of the NMOS transistors N3 and N4. As a result, writing operation to the memory cell array is performed at a higher speed as compared to the first and second preferred embodiments.

On the other hand, when the write control terminal WE is supplied with a write controlling signal at a level "0", indicating disable of writing operation, the third supply voltage VDD3 is supplied to the P-type substrate regions (P-well regions) of the NMOS transistors N3 and N4.

Figure 6:
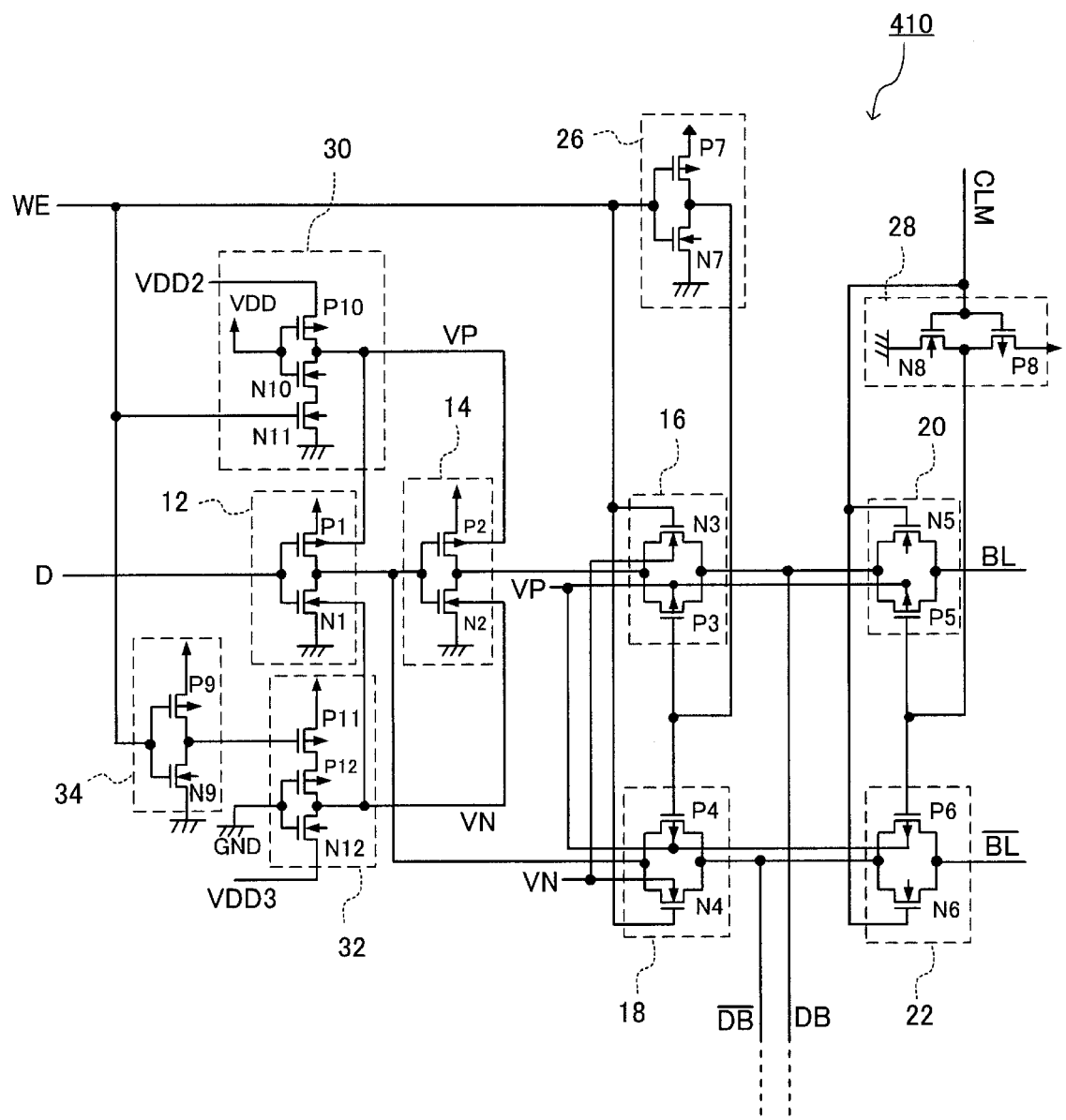
FIG. 6 is a circuit diagram showing a writing operation control circuit 410 for a semiconductor memory according to a fourth preferred embodiment of the present invention.

FIG. 6 is a circuit diagram showing a writing operation control circuit 410 for a semiconductor memory according to a fourth preferred embodiment of the present invention. In FIG. 6, the same or corresponding elements to those shown in FIGS. 1–5 are represented by the same reference numerals, and the same description is not repeated. In the fourth preferred embodiment, the output terminal of the first voltage control circuit 30 is connected to N-type substrate regions (N-well regions) of the PMOS transistors P5 and P6 in the third and fourth transfer gates 20 and 22.

According to this embodiment, when the write control terminal WE is supplied with a write controlling signal at a level "1", indicating enable of writing operation, the first supply voltage VDD is supplied to the N-type substrate regions (N-well regions) of the PMOS transistors P5 and P6. As a result, writing operation to the memory cell array is performed at a higher speed as compared to the first to third preferred embodiments.

On the other hand, when the write control terminal WE is supplied with a write controlling signal at a level "0", indicating disable of writing operation, the second supply voltage VDD2 is supplied to the N-type substrate regions (N-well regions) of the PMOS transistors P5 and P6.

Figure 7:
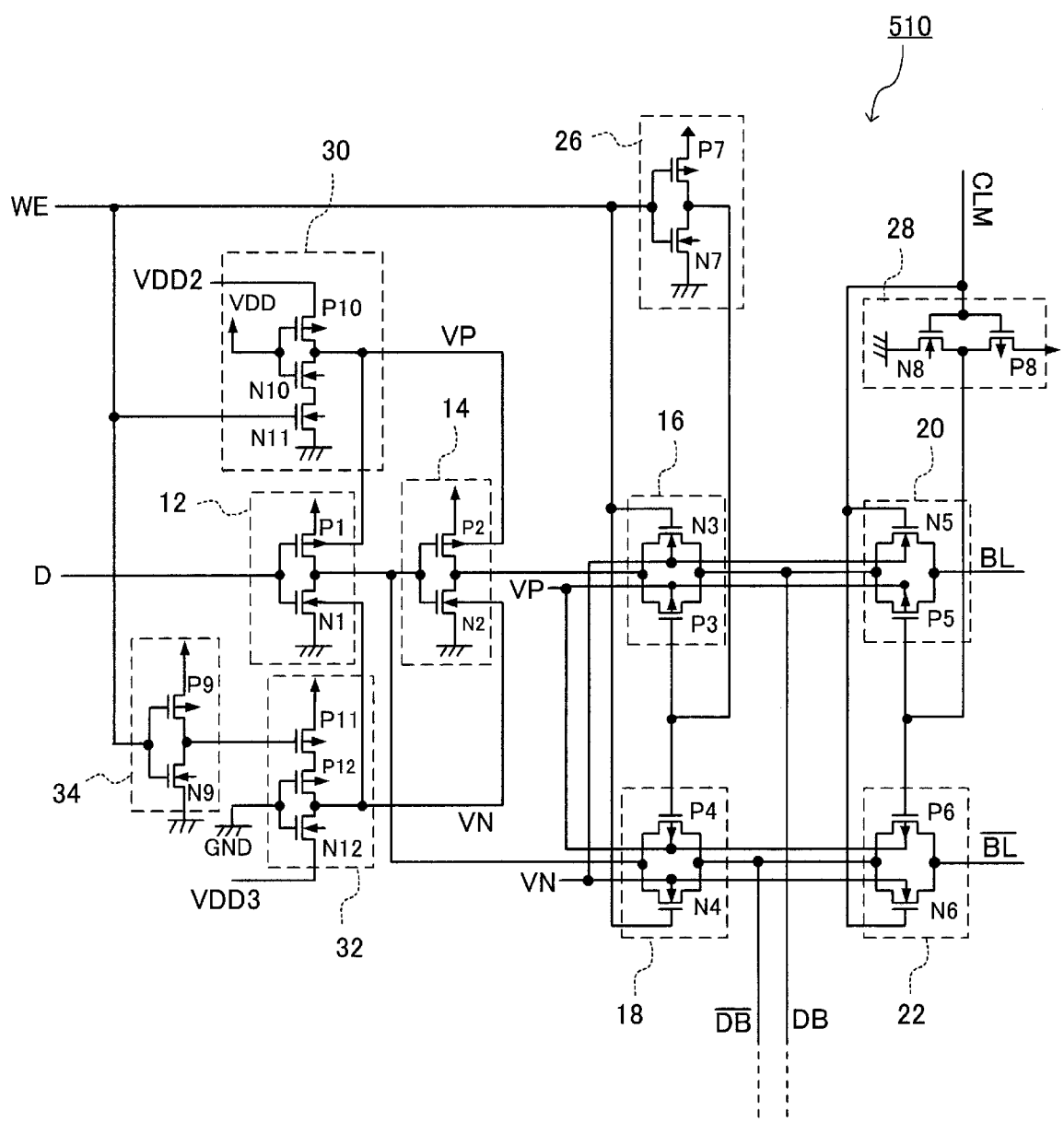
FIG. 7 is a circuit diagram showing a writing operation control circuit 510 for a semiconductor memory according to a fifth preferred embodiment of the present invention.

FIG. 7 is a circuit diagram showing a writing operation control circuit 510 for a semiconductor memory according to a fifth preferred embodiment of the present invention. In FIG. 7, the same or corresponding elements to.those shown in FIGS. 1–6 are represented by the same reference numerals, and the same description is not repeated. In the fifth preferred embodiment, the output terminal of the second voltage control circuit 32 is also connected to P-type substrate regions (P-well regions) of the NMOS transistors N5 and N6 in the first and second transfer gates 16 and 18.

According to this embodiment, when the write control terminal WE is supplied with a write controlling'signal at a level "1", indicating enable of writing operation, the fourth supply voltage GND is supplied to the P-type substrate regions (P-well regions) of the NMOS transistors N5 and N6. As a result, writing operation to the memory cell array is performed at a higher speed as compared to the first to fourth preferred embodiments.

On the other hand, when the write control terminal WE is supplied with a write controlling signal at a level "0", indicating disable of writing operation, the third supply voltage VDD3 is supplied to the P-type substrate regions (P-well regions) of the NMOS transistors N5 and N6.

Figure 8:
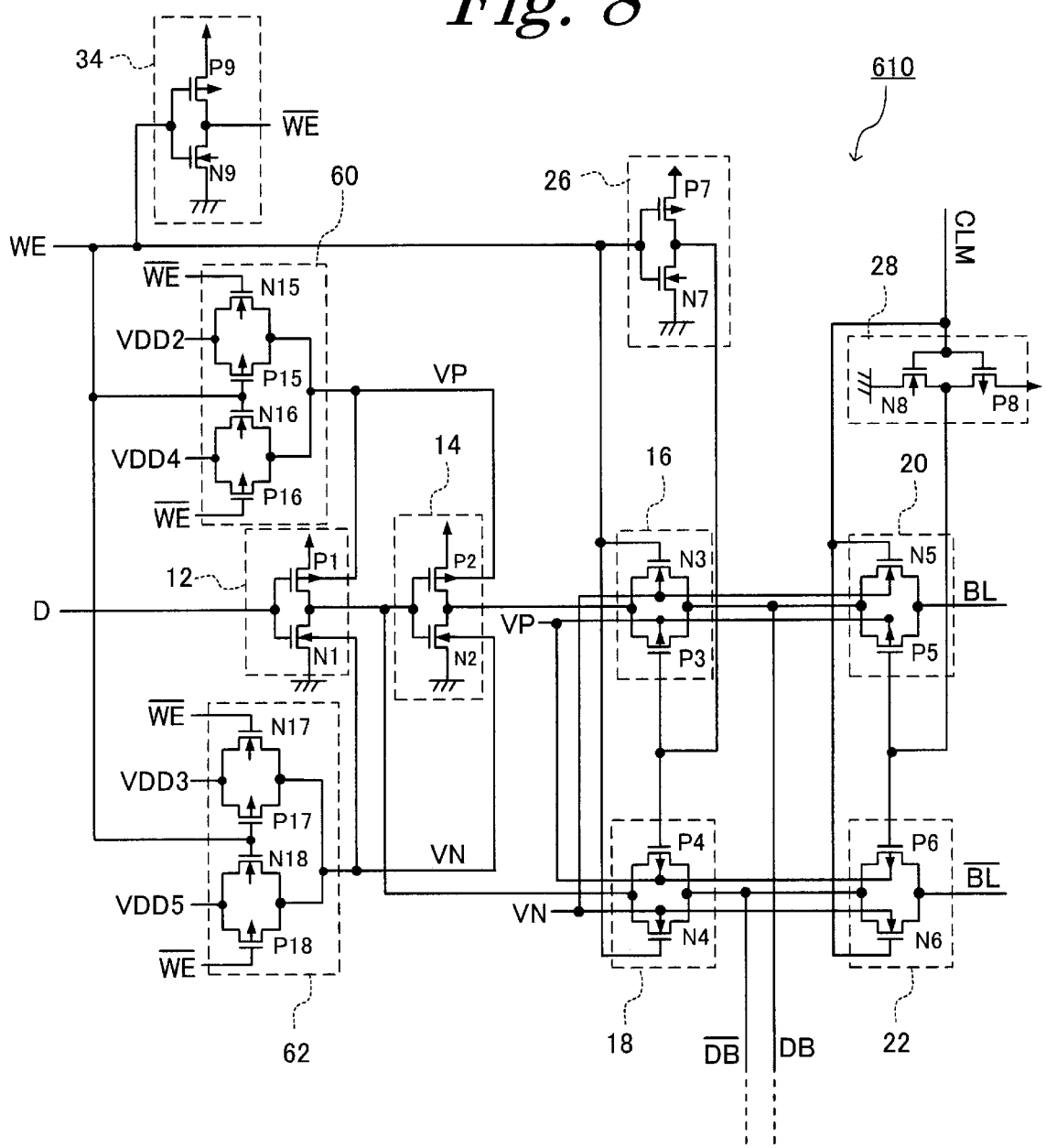
FIG. 8 is a circuit diagram showing a writing operation control circuit 610 for a semiconductor memory according to a sixth preferred embodiment of the present invention.

FIG. 8 is a circuit diagram showing a writing operation control circuit 610 for a semiconductor memory according to a sixth preferred embodiment of the present invention. In FIG. 8, the same or corresponding elements to those shown in FIGS. 1–7 are represented by the same reference numerals, and the same description is not repeated. The writing operation control circuit 610 includes different type of first and second voltage control circuits 60 and 62 instead of the circuits 30 and 32, employed in the first to fifth preferred embodiments. An inverter circuit 34, is coupled to the write control terminal WE to generate a reverse signal of the write controlling signal.

The first voltage control circuit 60 selects one of the first and second supply-voltages VDD4 and VDD2. The first voltage control circuit 60 includes a first gate circuit having NMOS and PMOS transistors N15 and P15, an input terminal of which is supplied with the second supply voltage VDD2; and a second gate circuit having NMOS and PMOS transistors N16, P16, an input terminal of which is supplied with the first supply voltage VDD4. Gates of the PMOS and NMOS transistors P15 and N15 are supplied with the write controlling signal and reverse signal thereof, respectively. The gates of the NMOS and PMOS transistors N16 and P16 are supplied with the write controlling signal and reverse signal thereof, respectively.

The second voltage control circuit 62 selects one of the third and fourth supply-voltages VDD3 and VDD5. The second voltage control circuit 62 includes a first gate circuit having NMOS and PMOS transistors N17 and P17, an input terminal of which is supplied with the third supply voltage VDD3; and a second gate circuit having NMOS and PMOS transistors N18 and P18, an input terminal of which is supplied with the fourth supply voltage VDD5. Gates of the PMOS and NMOS transistors P17 and N17 are supplied with the write controlling signal and reverse signal thereof, respectively. The gates of the NMOS and PMOS transistors N18 and P18 are supplied with the write controlling signal and reverse signal thereof, respectively.

An output terminal of the first voltage control circuit 60 is connected to N-type substrate regions of the PMOS transistors P1, P2, P3, P4 and P5. An output terminal of the second voltage control circuit 62 is connected to P-type substrate regions of the NMOS transistors N1, N2, N3, N4 and N5.

The first and second voltage control circuits 60 and 62 can be applied to the above-described first to fifth preferred embodiment instead of the control circuits 30 and 32.

Figure 9:
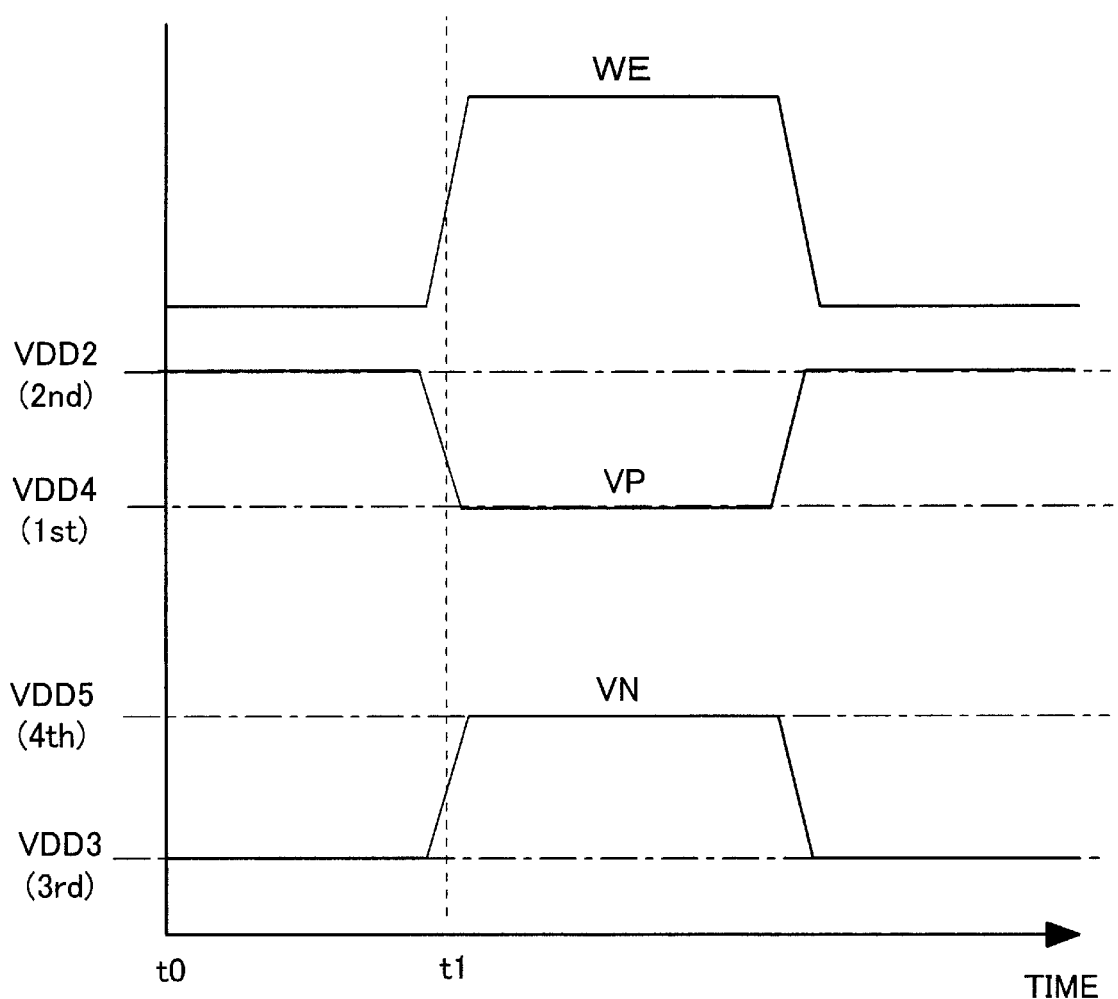
FIG. 9 is a timing chart showing the operation of the sixth preferred embodiment.

Next, referring to FIG. 9, when the write control terminal WE is supplied with a write controlling signal at a level "1", indicating enable of writing operation, the first and second voltage control circuits 60 and 62 output the first and fourth supply voltages VDD4 and VDD5, respectively. At this time, the PMOS transistors P1, P2, P3, P4 and P5 and NMOS transistors N1, N2, N3, N4 and N5 have lower threshold voltages. As a result, writing operation to the memory cell array is performed at a higher speed, as well as the fifth preferred embodiment. In addition, according to the sixth preferred embodiment, the first and fourth supply voltages VDD4 and VDD5 can be determined arbitrarily. Therefore, operating speed of the semiconductor memory can be changed easily.

On the other hand, when the write control terminal WE is supplied with a write controlling signal at a level "0", indicating disable of writing operation, the first and second voltage control circuits 60 and 62 output the second and third supply voltages VDD2 and VDD3, respectively. At this time, the PMOS transistors P1, P2, P3, P4 and P5 and NMOS transistors N1, N2, N3, N4 and N5 have lower threshold voltages. As a result, standby leak current is reduced.

What is claimed is:

1. A writing operation control circuit for a semiconductor memory, comprising:
   a write control terminal, to which a write controlling signal indicating enable or disable of writing is supplied;
   a writing data terminal, to which a writing data signal is supplied;
   a driving circuit which operates to perform a writing operation in response to the writing data signal, the driving circuit having a specific threshold voltage;
   a first voltage control circuit which selectively outputs first and second supply voltages to the driving circuit in response to a logical level of the write controlling signal; and
   a second voltage control circuit which selectively outputs third and fourth supply voltages to the driving circuit in response to a logical level of the write controlling signal, wherein
   the second supply voltage is higher than the first supply voltage, the first supply voltage is higher than the fourth supply voltage, the fourth supply voltage is higher than the third supply voltage.

2. A writing operation control circuit according to claim 1, wherein
   the first voltage control circuit outputs the first supply voltage and second supply voltage, when the write controlling signal is at a logical level indicating enable and disable of writing, respectively, and
   the second voltage control circuit outputs the fourth supply voltage and third supply voltage, when the write controlling signal is at a logical level indicating enable and disable of writing, respectively.

3. A writing operation control circuit according to claim 2, wherein
   the threshold voltage of the driving circuit becomes a first level when the write controlling signal is at a logical level indicating enable of writing, and becomes a second level, which is lower than the first level, when the write controlling signal is at a logical level indicating disable of writing.

4. A writing operation control circuit according to claim 3, wherein
   the driving circuit comprises first and second CMOS inverters, each comprising PMOS and NMOS transistors; and
   an output terminal of the first voltage control circuit is coupled to N-type substrate regions in the PMOS transistors of the first and second CMOS inverters, and an output terminal of the second voltage control circuit is coupled to P-type substrate regions in the NMOS transistors of the first and second CMOS inverters.

5. A writing operation control circuit according to claim 4, further comprising an inverter circuit coupled to the write control terminal, wherein
   the first voltage control circuit comprises:
   a) a first PMOS transistor, source and gate of which are supplied with the second supply voltage and the first supply voltage, respectively;
   b) a first NMOS transistor, a drain of which is connected to a drain of the first PMOS transistor, and a gate of which is supplied with the first supply voltage; and
   c) a second NMOS transistor, a drain of which is connected to a source of the first NMOS transistor, and a gate of which is connected to the write control terminal, an output terminal of the first voltage control circuit being formed between the drains of the first PMOS transistor and first NMOS transistor, and
   the second voltage control circuit comprises:
   a) a second PMOS transistor, a gate of which is connected to an output of the inverter circuit;
   b) a third PMOS transistor, a source of which is connected to a drain of the second PMOS transistor, and a gate of which is grounded; and
   c) a third NMOS transistor, a drain of which is connected to a drain of the third PMOS transistor, and a source of which is supplied with the third supply voltage, an output terminal of the second voltage control circuit being formed between the drain of the third PMOS transistor and the drain of the third NMOS transistor.

6. A writing operation control circuit according to claim 5, further comprising:
   first and second transfer gates coupled to the first and second CMOS inverters, respectively, each of the first and second transfer gates comprising an NMOS transistor and a PMOS transistor, wherein the output terminal of the first voltage control circuit is coupled to N-type substrate regions of the PMOS transistors in the first and second transfer gates.

7. A writing operation control circuit according to claim 6, wherein
the output terminal of the second voltage control circuit is also coupled to P-type substrate regions of the NMOS transistors in the first and second transfer gates.

8. A writing operation control circuit according to claim 7, further comprising:
third and fourth transfer gates coupled to output terminals of the first and second transfer gates, respectively, each of the third and fourth transfer gates comprising an NMOS transistor and a PMOS transistor, wherein
the output terminal of the first voltage control circuit is coupled to N-type substrate regions of the PMOS transistors in the third and fourth transfer gates.

9. A writing operation control circuit according to claim 8, wherein
the output terminal of the first voltage control circuit is also coupled to P-type substrate regions of the NMOS transistors in the third and fourth transfer gates.

10. A writing operation control circuit according to claim 4, further comprising:
an inverter circuit coupled to the write control terminal to generate a reverse signal of the write controlling signal, wherein
the first voltage control circuit, which selects one of the first and second supply voltages, comprises:
a) a first gate circuit having NMOS and PMOS transistors, an input terminal of which is supplied with the second supply voltage, gates of the PMOS and NMOS transistors being supplied with the write controlling signal and reverse signal thereof, respectively; and
b) a second gate circuit having NMOS and PMOS transistors, an input terminal of which is supplied with the first supply voltage, gates of the NMOS and PMOS transistors being supplied with the write controlling signal and reverse signal thereof, respectively, and
the second voltage control circuit, which selects one of the third and fourth supply voltages, comprises:
a) a first gate circuit having NMOS and PMOS transistors, an input terminal of which is supplied with the third supply voltage, gates of the PMOS and NMOS transistors being supplied with the write controlling signal and reverse signal thereof, respectively; and
b) a second gate circuit having NMOS and PMOS transistors, an input terminal of which is supplied with the fourth supply voltage, gates of the NMOS and PMOS transistors being supplied with the write controlling signal and reverse signal thereof, respectively.

11. A writing operation control circuit according to claim 10, further comprising:
first and second transfer gates coupled to the first and second CMOS inverters, respectively, each of the first and second transfer gates comprising an NMOS transistor and a PMOS transistor, wherein
the output terminal of the first voltage control circuit is coupled to N-type substrate regions of the PMOS transistors in the first and second transfer gates.

12. A writing operation control circuit according to claim 11, wherein
the output terminal of the second voltage control circuit is also coupled to P-type substrate regions of the NMOS transistors in the first and second transfer gates.

13. A writing operation control circuit according to claim 12, further comprising:
third and fourth transfer gates coupled to output terminals of the first and second transfer gates, respectively, each of the third and fourth transfer gates comprising an NMOS transistor and a PMOS transistor, wherein
the output terminal of the first voltage control circuit is coupled to N-type substrate regions of the PMOS transistors in the third and fourth transfer gates.

14. A writing operation control circuit according to claim 13, wherein
the output terminal of the first voltage control circuit is also coupled to P-type substrate regions of the NMOS transistors in the third and fourth transfer gates.

15. A semiconductor memory, comprising:
a plurality of memory cells each of which store digital data; and
a writing operation control circuit connected to the plurality of memory cells, wherein
the writing operation control circuit comprises:
a) a write control terminal, to which a write controlling signal indicating enable or disable of writing is supplied;
b) a writing data terminal, to which a writing data signal is supplied;
c) a driving circuit which operates to perform a writing operation in response to the writing data signal, the driving circuit having a specific threshold voltage;
d) a first voltage control circuit which selectively outputs first and second supply voltages to the driving circuit in response to a logical level of the write controlling signal; and
e) a second voltage control circuit which selectively outputs third and fourth supply voltages to the driving circuit in response to a logical level of the write controlling signal, wherein
the second supply voltage is higher than the first supply voltage, the first supply voltage is higher than the fourth supply voltage, the fourth supply voltage is higher than the third supply voltage.

16. A semiconductor memory according to claim 15, wherein
the first voltage control circuit outputs the first supply voltage and second supply voltage, when the write controlling signal is at a logical level indicating enable and disable of writing, respectively, and
the second voltage control circuit outputs the fourth supply voltage and third supply voltage, when the write controlling signal is at a logical level indicating enable and disable of writing, respectively.

17. A semiconductor memory according to claim 16, wherein
the threshold voltage of the driving circuit becomes a first level when the write controlling signal is at a logical level indicating enable of writing, and becomes a second level, which is lower than the first level, when the write controlling signal is at a level indicating disable of writing.

18. A semiconductor memory according to claim 17, wherein
the driving circuit comprises first and second CMOS inverters, each comprising PMOS and NMOS transistors; and an output terminal of the first voltage control circuit is coupled to N-type substrate regions in the PMOS transistors of the first and second CMOS inverters, and an output terminal of the second voltage control circuit is coupled to P-type substrate regions in the NMOS transistors of the first and second CMOS inverters.

19. A semiconductor memory according to claim 18, wherein
the writing operation control circuit further comprises an inverter circuit coupled to the write control terminal, wherein
the first voltage control circuit comprises:
a) a first PMOS transistor, source and gate of which are supplied with the second supply voltage and the first supply voltage, respectively;
b) a first NMOS transistor, a drain of which is connected to a drain of the first PMOS transistor, and a gate of which is supplied with the first supply voltage; and
c) a second NMOS transistor, a drain of which is connected to a source of the first NMOS transistor, and a gate of which is connected to the write control terminal, an output terminal of the first voltage control circuit being formed between the drains of the first PMOS transistor and first NMOS transistor, and
the second voltage control circuit comprises:
a) a second PMOS transistor, a gate of which is connected to an output of the inverter circuit;
b) a third PMOS transistor, a source of which is connected to a drain of the second PMOS transistor, and a gate of which is grounded; and
c) a third NMOS transistor, a drain of which is connected to a drain of the third PMOS transistor, and a source of which is supplied with the third supply voltage, an output terminal of the second voltage control circuit being formed between the drain of the third PMOS transistor and the drain of the third NMOS transistor.

20. A semiconductor memory according to claim 19, wherein the writing operation control circuit further comprises:
first and second transfer gates coupled to the first and second CMOS inverters, respectively, each of the first and second transfer gates comprising an NMOS transistor and a PMOS transistor, wherein
the output terminal of the first voltage control circuit is coupled to N-type substrate regions of the PMOS transistors in the first and second transfer gates.

21. A semiconductor memory according to claim 20, wherein the output terminal of the second voltage control circuit is also coupled to P-type substrate regions of the NMOS transistors in the first and second transfer gates.

22. A semiconductor memory according to claim 21, wherein the writing operation control circuit further comprises:
third and fourth transfer gates coupled to output terminals of the first and second transfer gates, respectively, each of the third and fourth transfer gates comprising an NMOS transistor and a PMOS transistor, wherein
the output terminal of the first voltage control circuit is coupled to N-type substrate regions of the PMOS transistors in the third and fourth transfer gates.

23. A semiconductor memory according to claim 22, wherein
the output terminal of the first voltage control circuit is also coupled to P-type substrate regions of the NMOS transistors in the third and fourth transfer gates.

24. A semiconductor memory according to claim 19, wherein the writing operation control circuit further comprises:
an inverter circuit coupled to the write control terminal to generate a reverse signal of the write controlling signal, wherein
the first voltage control circuit, which selects one of the first and second supply voltages, comprises:
a) a first gate circuit having NMOS and PMOS transistors, an input terminal of which is supplied with the second supply voltage, gates of the PMOS and NMOS transistors being supplied with the write controlling signal and reverse signal thereof, respectively; and
b) a second gate circuit having NMOS and PMOS transistors, an input terminal of which is supplied with the first supply voltage, gates of the NMOS and PMOS transistors being supplied with the write controlling signal and reverse signal thereof, respectively, and the second voltage control circuit, which selects one of
the third and fourth supply voltages, comprises:
a) a first gate circuit having NMOS and PMOS transistors, an input terminal of which is supplied with the third supply voltage, gates of the PMOS and NMOS transistors being supplied with the write controlling signal and reverse signal thereof, respectively; and
b) a second gate circuit having NMOS and PMOS transistors, an input terminal of which is supplied with the fourth supply voltage, gates of the NMOS and PMOS transistors being supplied with the write controlling signal and reverse signal thereof, respectively.

25. A semiconductor memory according to claim 19, wherein
the writing operation control circuit further comprises first and second transfer gates coupled to the first and second CMOS inverters, respectively, each of the first and second transfer gates comprising an NMOS transistor and a PMOS transistor, wherein
the output terminal of the first voltage control circuit is coupled to N-type substrate regions of the PMOS transistors in the first and second transfer gates.

26. A semiconductor memory according to claim 24, wherein
the output terminal of the second voltage control circuit is also coupled to P-type substrate regions of the NMOS transistors in the first and second transfer gates.

27. A semiconductor memory according to claim 25, wherein
the writing operation control circuit further comprises third and fourth transfer gates coupled to output terminals of the first and second transfer gates, respectively, each of the third and fourth transfer gates comprising an NMOS transistor and a PMOS transistor, wherein
the output terminal of the first voltage control circuit is coupled to N-type substrate regions of the PMOS transistors in the third and fourth transfer gates.

28. A semiconductor memory according to claim 26, wherein
the output terminal of the first voltage control circuit is also coupled to P-type substrate regions of the NMOS transistors in the third and fourth transfer gates.

* * * * *